(12) United States Patent
Paul et al.

(10) Patent No.: US 11,587,601 B1
(45) Date of Patent: Feb. 21, 2023

(54) APPARATUS AND METHOD FOR CONTROLLED TRANSMITTING OF READ PULSE AND WRITE PULSE IN MEMORY

(71) Applicant: GlobalFoundries U.S. Inc., Malta, NY (US)

(72) Inventors: Bipul C. Paul, Mechanicville, NY (US); Shashank S. Nemawarkar, Austin, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 33 days.

(21) Appl. No.: 17/445,461

(22) Filed: Aug. 19, 2021

(51) Int. Cl.
*G11C 7/22* (2006.01)
*G11C 7/10* (2006.01)

(52) U.S. Cl.
CPC ........... *G11C 7/222* (2013.01); *G11C 7/1039* (2013.01); *G11C 7/1048* (2013.01); *G11C 7/1069* (2013.01); *G11C 7/1096* (2013.01)

(58) Field of Classification Search
CPC ..... G11C 7/222; G11C 7/1039; G11C 7/1048; G11C 7/1069; G11C 7/1096
See application file for complete search history.

(56) References Cited

U.S. PATENT DOCUMENTS

| | | | |
|---|---|---|---|
| 4,924,375 A | 5/1990 | Fung et al. | |
| 9,524,773 B2 * | 12/2016 | Lee | G11C 7/1039 |
| 9,633,721 B2 * | 4/2017 | Antonakopoulos | G11C 7/106 |
| 9,817,601 B1 * | 11/2017 | Zhang | G11C 29/52 |
| 9,837,144 B1 * | 12/2017 | Sinha | G11C 5/14 |
| 10,468,093 B2 * | 11/2019 | Chatterjee | G11C 11/4096 |
| 10,714,163 B2 | 7/2020 | Tan et al. | |
| 10,714,192 B2 | 7/2020 | Tokutomi et al. | |
| 2010/0146237 A1 * | 6/2010 | Takai | G11C 7/22 |
| | | | 711/E12.001 |
| 2022/0246206 A1 * | 8/2022 | Bhargava | G11C 11/418 |

OTHER PUBLICATIONS

Ikdea et al., "High-Speed DRAM Architecture Development," IEEE Journal of Solid-State Circuits, vol. 34, No. 5, May 1999, 8 pages.

* cited by examiner

*Primary Examiner* — Tri M Hoang
(74) *Attorney, Agent, or Firm* — David Cain; Hoffman Warnick LLC (57) ABSTRACT

Embodiments of the present disclosure provide an apparatus including a memory array including a plurality of sub-arrays. A plurality of temporary storage units (TSUs) is coupled to the plurality of sub-arrays. Each TSU indicates whether the respective sub-array is undergoing one of a read operation and a write operation. A control circuit is coupled to each of the plurality of sub-arrays through a data bus. The control circuit transmits a read pulse or a write pulse as a first pulse with a delay in response to the sub-array undergoing the read operation or the write operation and transmits, instantaneously, the first pulse to one of the plurality of sub-arrays in response to the sub-array not undergoing the read operation or the write operation.

20 Claims, 9 Drawing Sheets

APPARATUS AND METHOD FOR CONTROLLED TRANSMITTING OF READ PULSE AND WRITE PULSE IN MEMORY

TECHNICAL FIELD

Embodiments of the disclosure relate generally to memory circuits. More specifically, the disclosure provides an apparatus and method for controlled transmitting of read pulses and write pulses in memory.

BACKGROUND

Memory circuits, such as random-access memory (RAM), are important to the operation of integrated circuits (ICs). Memory circuits include a collection of electrically operated bit cells that can be read and/or written in any order and can electrically store working data or machine code for a device. Some types of RAM (e.g., static RAM) in particular are a "volatile" form of memory, in that power is required to maintain the stored information. Non-volatile memory, such as magnetic RAM, continues to hold data even when there is no power to the device. Despite the advantage of not needing continuous power to store data, non-volatile memory typically features slower and possibly different writing and reading times required for each pulse as compared to volatile memory. This limits the ability to use non-volatile memory solutions in certain contexts.

SUMMARY

Aspects of the disclosure provide an apparatus including: a memory array including a plurality of sub-arrays; a plurality of temporary storage units (TSUs) each coupled to a respective one of the plurality of sub-arrays, each TSU indicating whether the respective sub-array is undergoing one of a read operation and a write operation; and a control circuit coupled to each of the plurality of sub-arrays through a data bus, wherein the control circuit: transmits, with a delay, one of a read pulse and a write pulse as a first pulse in response to the sub-array undergoing one of the read operation and the write operation, and transmits, instantaneously, the first pulse to one of the plurality of sub-arrays in response to the sub-array not undergoing one of the read operation and the write operation.

Further aspects of the disclosure provide a memory access circuit including: a memory array including a plurality of random access memory (RAM) sub-arrays, each defining a respective data page; a data bus coupled to the plurality of RAM sub-arrays, each of the plurality of RAM sub-arrays having an respective coupling to the data bus; a plurality of temporary storage units (TSUs), each TSU of the plurality of TSUs coupled between the data bus and a respective one of the plurality of RAM sub-arrays, and indicating whether a target data page is undergoing one of a read operation and a write operation; and a control circuit coupled to the data bus for controlling access to the plurality of RAM sub-arrays, wherein the control circuit: transmits, with a delay, one of a read pulse and a write pulse as a first pulse in response to the sub-array undergoing one of the read operation and the write operation, and transmits, instantaneously, the first pulse to one of the plurality of sub-arrays in response to the sub-array not undergoing one of the read operation and the write operation.

Additional aspects of the disclosure provide a method including: detecting, in a control circuit coupled to a memory array having a plurality of sub-arrays coupled through a data bus, one of a read pulse and a write pulse as a first pulse for a selected sub-array; transmitting, with a delay, one of a read pulse and a write pulse as a first pulse in response to the sub-array undergoing one of the read operation and the write operation; and transmitting, instantaneously, the first pulse to one of the plurality of sub-arrays in response to the sub-array not undergoing one of the read operation and the write operation.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide an apparatus and related method for controlled transmitting of read pulses and write pulses in a memory circuit. Embodiments of the disclosure may be particularly suitable for non-volatile memory, and/or other applications where comparatively longer processing time is needed to complete a read operation or write operation. Embodiments of the disclosure reduce the effect of such processing times, e.g., by temporarily queueing the next read or write operation for a particular sub-array while it is busy, allowing another sub-array to be read or written concurrently. An apparatus according to the disclosure thus may include a memory array including a plurality of sub-arrays. One or more sub-arrays may be organized into "pages," each having a respective number of bit cells for reading of data from, and/or writing of data to, the memory circuit. A temporary storage unit (TSU) including latches, flip-flops, and/or other fundamental memory elements may be coupled to one of the sub-arrays to indicate whether the corresponding sub-array is undergoing a read operation or write operation. A control circuit is coupled to each of the plurality of sub-arrays through a data bus. The control circuit may transmit a read pulse or write pulse to a particular sub-array as a "first pulse" with a delay, upon finding that the sub-array is currently implementing a read operation or a write operation. In the case that the sub-array is not currently being read or written, the control circuit transmits, instantaneously, the first pulse. Thus, the concurrent reading or writing of a particular sub-array will not stop the control circuit from reading data from, or writing data to, other sub-arrays in the same memory array. Among other effects, an apparatus or method according to the disclosure can allow some portions of data to be read or written out of order without affecting the accuracy of reading or writing data in the memory circuit.

Figure 1:
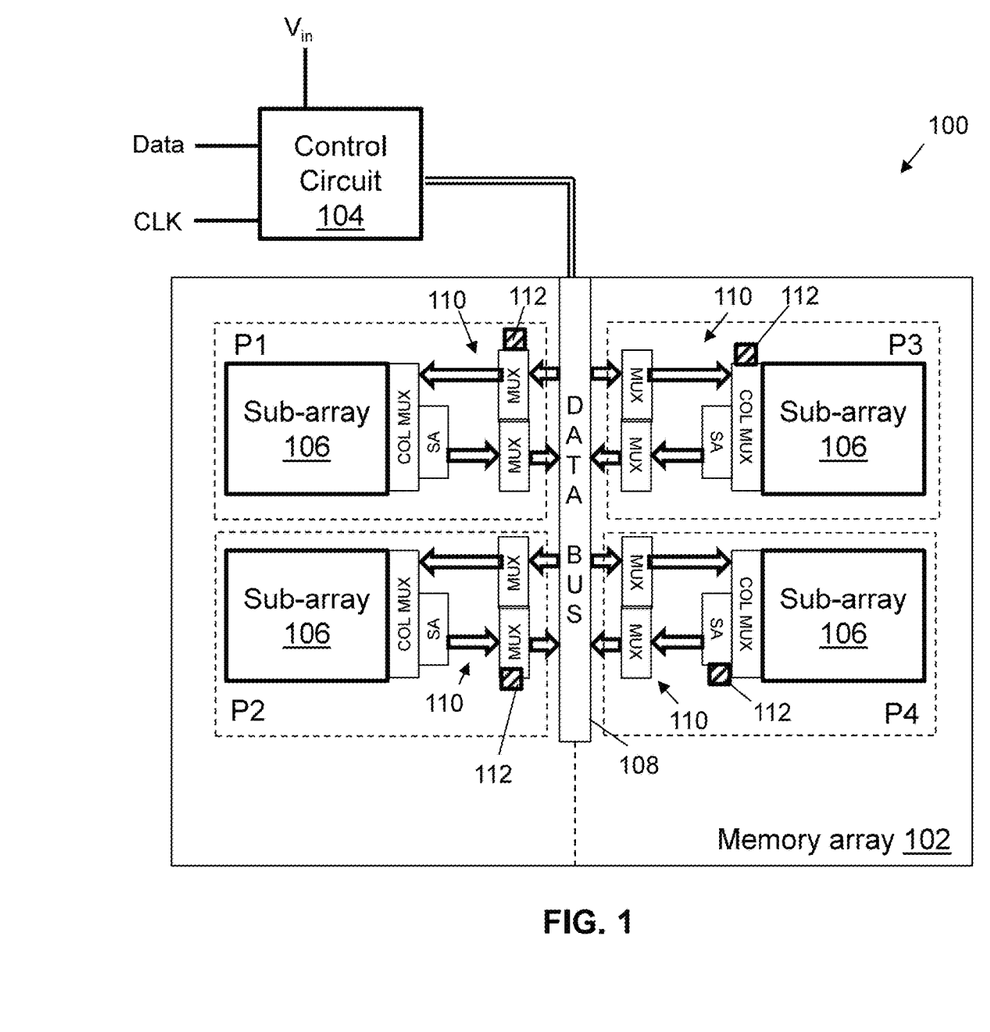
FIG. 1 shows a schematic view of a memory cell with multiple sub-arrays connected through a data bus according to embodiments of the disclosure.

FIG. 1 depicts a system 100 including a memory array 102 and a control circuit 104 for controlling the transmission of read and write pulses to memory array 102. Write and read pulses transmitted to memory array 102 will enable the reading of data from, or the writing of data to, various portions of memory array 102. Memory array 102 may be organized into a group of pages (example pages P1, P2, P3, P4 shown), each having a corresponding sub-array 106 for storing data as digital bits. Any of pages P1, P2, P3, P4, etc., may include only one sub-array 106 therein or may include two or more sub-arrays 106. Sub-arrays 106 thus may include at least one (more commonly several) bit cells for recording individual logic levels representing a portion of data. Each bit cell in sub-array 106 may indicate a low logic level (e.g., a zero or "low" voltage) or a high logic level (e.g., a non-zero or "high" voltage) as part of a word or "byte" having several distinct binary digits ("bits").

A data bus 108 may electrically couple control circuit 104 to each page P1, P2, P3, P4 (and sub-array(s) 106 therein) in memory array 102. Data bus 108 may include a collection of data-transmitting components such as wires, optical fibers, etc., for transferring data in the form of electrical or optical signals between two or more components. According to an example, each page P1, P2, P3, P4 and sub-array 106 may have an interleaved arrangement. That is, sub-arrays 106 in a physical layout may be arranged in pairs on opposite horizontal sides of data bus 108, and/or may alternate from left to right along the length of data bus 108. Portions of data bus 108 are shown with dashed lines to indicate an indeterminate length. Data bus 108 can transmit signals for writing data to, or reading data from, sub-arrays 106 in memory array 102. Control circuit 104 as discussed herein may control the transmitting of read or write pulses through data bus 108, such that they are delivered to sub-arrays 106 for reading or writing of data therein without interfering with ongoing, unfinished read or write operations.

Control circuit 104 may be embodied as a digital logic circuit, computing device, and/or other control signal configured to electrically control data pulses delivered to data bus 108, such that information is read to and/or written from sub-arrays 106 only as dictated via control circuit 104. However embodied, control circuit 104 may determine, before transmitting a read or write pulse to sub-array(s) 106, whether the targeted sub-array(s) 106 is/are already undergoing a read or write operation. If a read or write operation is currently being performed in the targeted sub-array(s) 106, the next pulse for that sub-array is temporarily queued in control circuit 104 and another pulse for another page may instead be transmitted for reading or writing. This selective queuing and delaying can allow memory to be read from, or written to, memory array 102 out of order. Control circuit 104 additionally can reorganize and/or reassemble any portions of data that are read or written out of order before they are used in other portions of a device.

Control circuit 104 includes several terminals to receive and process the reading or writing of data in memory array 102. Control circuit 104 may include, e.g., a supply voltage ($V_{in}$) for powering control circuit 104, a clock terminal (CLK) to drive signal processing within control circuit 104, and a data terminal (Data) for providing data signals to control circuit 104, e.g., incoming instructions to read or write data in memory array 102. Control circuit 104 may process the incoming signals to transmit read and/or write pulses to memory array 102 via data bus 108. Control circuit 104 may implement such functions using digital logic circuitry, algorithms, look-up tables, and/or other hardware or software instructions for implementing the operational methodologies described herein for controlling the transmission of read or write signals to memory array 102.

Each sub-array 106 may be coupled to data bus 108 through a temporary storage unit (TSU) 110, having various sub-components for routing and/or otherwise processing data before it enters sub-array 106 to be read or written. Each TSU 110 may include various elements for temporary storage of data (e.g., without the use of bit cells or other memory components in sub-array 106), to indicate whether a respective sub-array 106 is currently being read or written by an earlier transmitted pulse. In some cases, TSU(s) 110 may operate as a queue for data that is currently being written to, or read from, its respective sub-array 106. TSUs 110 generally may include, e.g., a set of multiplexers (labeled MUX) and a column multiplexer (labeled COL MUX) for directing incoming read/write pulses to a column and row where a particular bit cell is targeted for reading or writing. TSUs 110 further may include a sensing circuit such as a sense amplifier (also known in the art as a "sense amp" and labeled "SA" in FIG. 1) for amplifying measured voltages in sub-array 106. SA of TSUs 110 may be able to sense the low amplitude power signals representing a data bit in sub-array 106 and amplify it to higher voltage logic levels capable of being processed and interpreted by other circuitry. Sensing circuits may include several transistors (e.g., typically four but sometimes as few as two or as many as thirteen transistors) for converting the output from column multiplexer COL MUX into a signal indicating the memory state of bit cells in sub-array 106.

Portions of TSU 110 (e.g., including the above-described multiplexers, sensing circuits, etc.) may include several temporary memory elements 112 such as latches, flip flops, and/or other circuits configured for temporary storage of bits. During operation, temporary memory elements 112 can be used to flag sub-array(s) 106 on each page P1, P2, P3, P4 as currently undergoing a read operation or write operation.

Additionally or alternatively, TSUs 110 may temporarily store data from a subsequent signal pulse until such data is overwritten in a subsequent pulse, or until the power supply to TSUs 110 (e.g., from supply voltage $V_{in}$) is disabled. Signal pulses delivered from control circuit 104 for writing in sub-arrays 106 may be delivered through TSUs 110, where logic elements can therein relay read or write signals to sub-arrays 106 directly, or otherwise divert them to temporary memory elements 112 for temporary storage over a set number of subsequent clock pulses. During operation, temporary memory elements 112 can temporarily hold read or write pulses before they are transmitted to a corresponding sub-array 106, e.g., in the case where that sub-array 106 is currently undergoing a read or write operation. Control circuit 104 may include logic for determining, e.g., based on a known amount of time needed to read or write data for sub-arrays 106, whether a subsequent pulse can be transmitted to sub-array(s) 106 for reading or writing of data.

According to an example implementation, one or more sub-arrays 106 may require, e.g., six clock pulses, to have data written thereto, but may require, e.g., four clock pulses to have data read therefrom. This example may be relative to bit cells within sub-arrays 106 that include non-volatile memory elements, e.g., MRAM as described herein. In the case where a subsequent clock pulse (e.g., a second consecutive pulse for reading or writing data in the same sub-array) is directed to sub-array(s) 106 while it is already being read or written, embodiments of the disclosure allow temporary storage of data in the subsequent pulse while pulses to other sub-arrays 106 are transmitted to memory array 102. Control circuit 104 may include, e.g., logic for determining whether sub-array(s) 106 are currently undergoing a read or write operation. For example, where a write pulse is transmitted to sub-array 106 on first page P1, control circuit 104 will identify first page P1 as undergoing a write operation for each of the next five clock pulses. The identification can be provided through TSU(s) 110, which may deliver a signal indicating the operational state of sub-array(s) 106 on a given page P1, P2, P3, P4 during the read operation or write operation. If one of the next five clock pulses includes a read or write operation to be performed on page P1, control logic 104 will transmit the pulse with a delay (e.g., for the number of clock pulses needed before the write operation ends), e.g., by transmitting the pulse to TSU 110 coupled to page P1. If the next read or write pulse directed to page P1 is after the write operation concludes, control circuit 104 will transmit the subsequent read pulse or write pulse to sub-array 106 of page P1 without a delay (i.e., without transmitting it through TSU 110).

Figure 2:
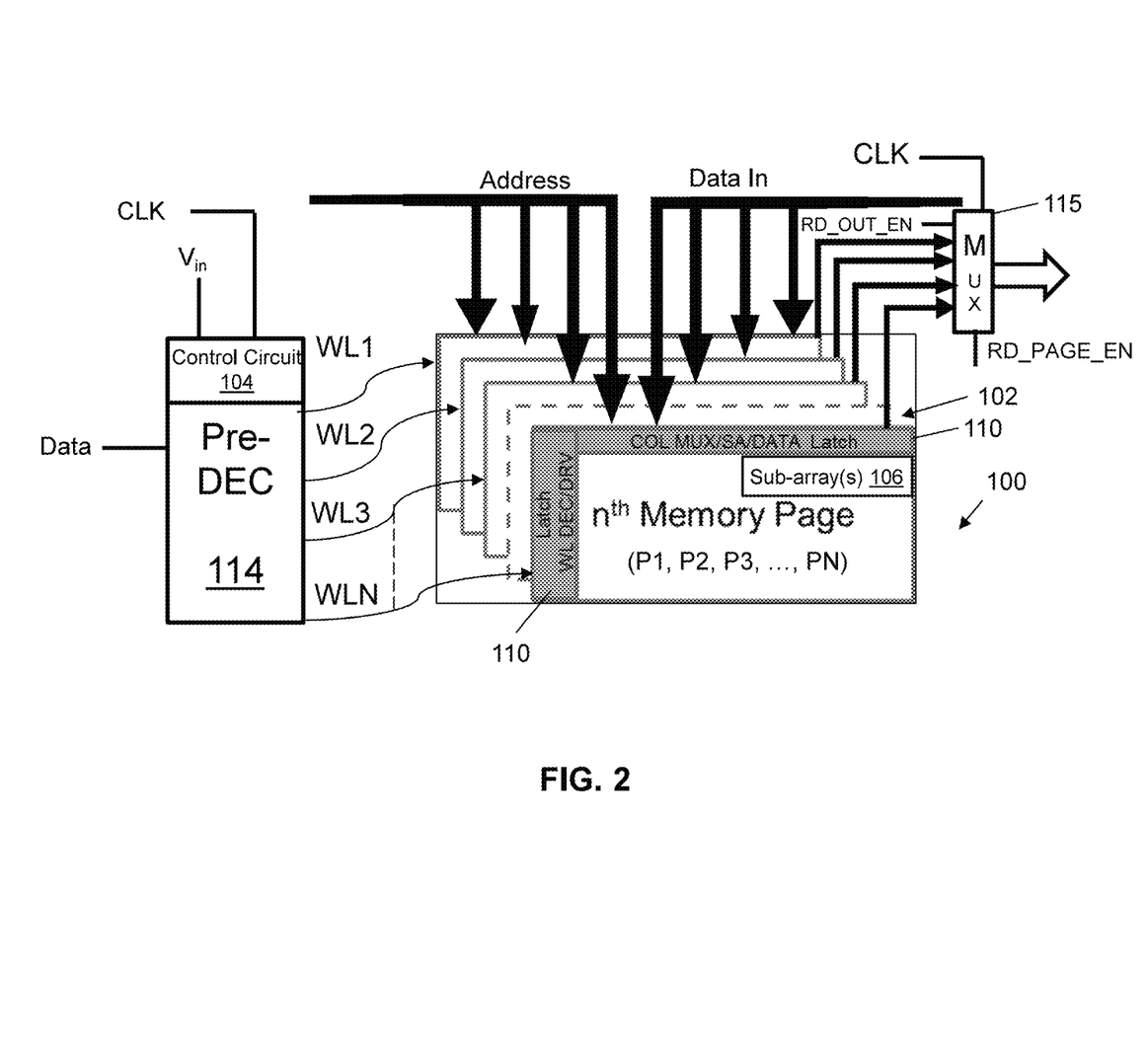
FIG. 2 shows a schematic view of a pre-decoder and control circuit coupled to a memory cell according to embodiments of the disclosure.

Referring to FIG. 2, other hardware configurations may provide system 100 and/or various aspects of the operational methodology described herein. For example, control circuit 104 may be included within a pre-decoder 114 (Pre-DEC in FIG. 2) coupled to memory array 102 through a set of word lines (each labeled "WL"), each corresponding to several pages (P1, P2, P3, through PN indicating a last page). Data bus 108 (FIG. 1) within memory array 102 is coupled to each of the various pages in such a configuration but is omitted from FIG. 2 for sake of illustration. A pre-decoder is a hardware element for memory circuits for finding and marking boundaries between portions of a digital word, e.g., by decoding bit prefixes and/or checking for certain properties within a signal. Pre-decoder 114 thus may be capable of distinguishing write pulses from read pulses, and/or between pages P1, P2, P3, P4, etc., where such operations will be performed. In implementations where control circuit 104 is included within pre-decoder 114, various functions of pre-decoder 114 may also be used to control the transmission of read and write pulses to memory array 102.

Pre-decoder 114 may be electrically connected to several sub-arrays 106, pages, and/or memory arrays 102 through respective word lines (each abbreviated "WL" in FIG. 2). Including control circuit 104 within pre-decoder 114 may easily integrate embodiments of system 100 into an existing architecture with little to no effect on available surface area. Each word line WL, furthermore, can allow control circuit 104 of pre-decoder 114 to access a respective page within memory array 102 via control circuitry managed within pre-decoder 114. In this configuration, read or write pulses transmitted to memory array 102 can include a set of "least significant bits," or a "least significant byte" (both abbreviated LSB), for indicating the address of a particular page and/or sub-array 106. As an example, each pulse for reading or writing data in memory array 102 may include a five-bit LSB to select from one of a range of thirty-two pages. A larger or smaller size LSB string can be used to select from different numbers of possible pages in other embodiments. The incoming data to pre-decoder 114 may include a combination of data and address bits, respectively designating an operation to be performed (reading or writing of data) and a sub-array 106 to be read or written. Pre-decoder 114 can interpret the address bits within incoming pulses as particular pages and/or sub-arrays 106 where each operation will be performed. Like other configurations described herein, TSUs 110 may include latches within a multiplexer or other component, e.g., a row decoder coupled to each of the various word lines.

Figure 3:
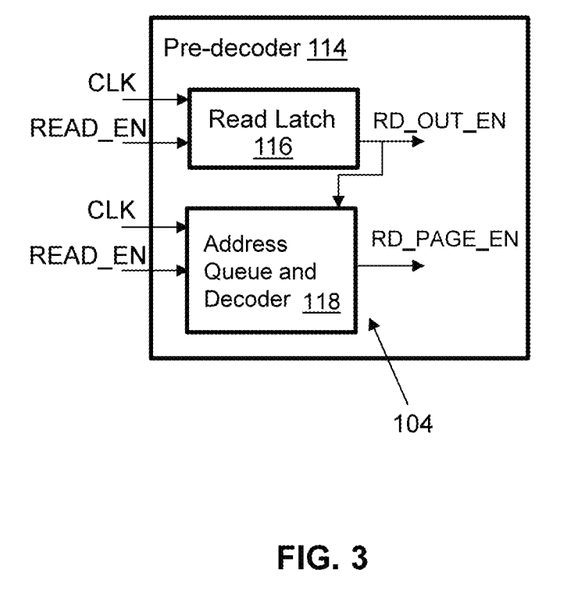
FIG. 3 shows an expanded schematic view of a pre-decoder and sub-components according to embodiments of the disclosure.

Referring to FIGS. 2 and 3 together, an expanded schematic view of control circuit 104 within pre-decoder 114 is shown in FIG. 3 to further illustrate the functions of control circuit 104. The example of pre-decoder 114 depicted in FIG. 3 is one example of a digital circuit structure for implementing the various functions described herein, and it is understood that additional and/or alternative functions may be used in other implementations. Pre-decoder 114 may be configured for only partially decoding incoming signals before their transmission to memory circuit 102. Specifically, pre-decoder 114 may split an incoming encoded signal ("READ_EN" in the case of an encoded read signal) into two parallel encoded signals. Such signals may be identified as "RD_OUT_EN" to specify when the data is available to data bus 108 after the data is read from a subarray. This signal can be generated based on a predefined read latency known for a particular memory array. The signal indicated "RD_PAGE_EN" can be used to specify the sequence of the memory subarray/page addresses in which read was requested. These signals may be transmitted to a multiplexer ("MUX") 115 configured for routing data from selected pages to a sense amplifier or other component for measuring the memory state in sub-array(s) 106. Specifically, signal RD_OUT_EN will control multiplexer 115 based on whether the data is available for routing through data bus 108, and signal RD_PAGE_EN will allow multiplexer 115 to transmit relevant data to interconnected components in the correct order previously specified in pre-decoder 114.

Pre-decoder 114 may receive a clock input "CLK" to define the processing frequency of pre-decoder 114 in parallel with the incoming encoded signal ("READ_EN" in the example of a read signal). Both inputs may be delivered in parallel with each other to two subcomponents of pre-decoder 114, e.g., a read latch 116 and an address queue and decoder 118. Read latch 116 may temporarily store all or a portion of encoded signal READ/EN to indicate the order in which incoming signals were received to allow re-ordering as needed in multiplexer 115. Address queue and decoder 118 may also receive signal RD_OUT_EN as an input with the input clock and READ_EN signals to produce signal RD_PAGE_EN. As noted elsewhere herein, signal RD_PAGE_EN is an additional signal provided to multiplexer 115 solely to indicate the correct reading or writing order of data in memory array 102. Pre-decoder 114 thereby produces two signals, to control multiplexer 115 as memory array 102 is read, to avoid possible errors arising from data being read or written out of order.

Figure 4:
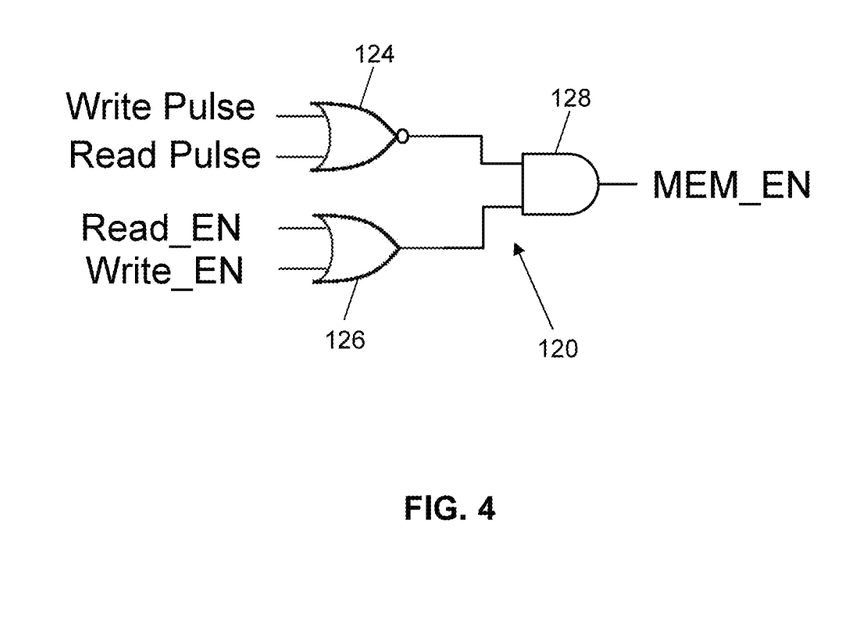
FIG. 4 shows a schematic view of logic for transmitting a signal to indicate memory availability according to embodiments of the disclosure.
Figure 5:
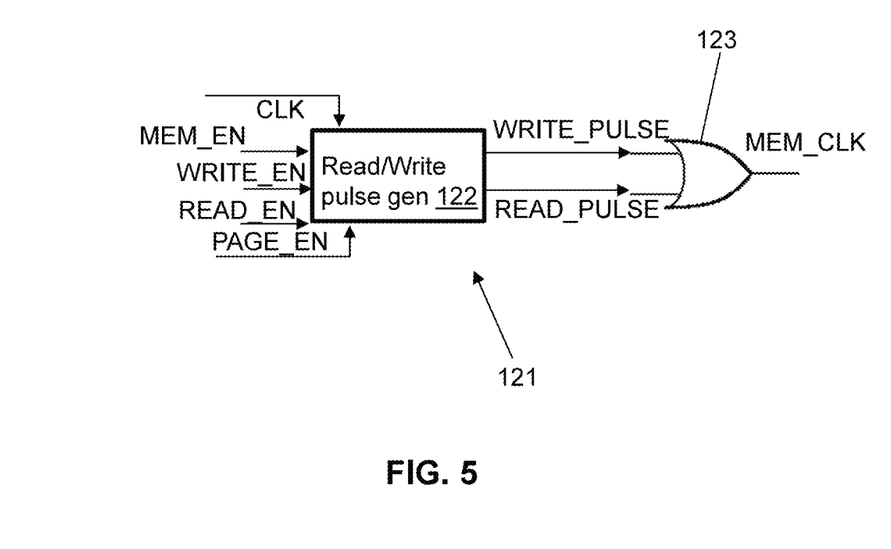
FIG. 5 shows a schematic view of logic for generating a read pulse or write pulse as a first pulse according to embodiments of the disclosure.

FIGS. 4 and 5 depicts an example of a memory check circuit 120 and a pulse logic circuit 121 for generating read or write pulses to memory array 102, to read and write data according to incoming encoded signals (e.g., from pre-decoder 114 (FIG. 3)). For example, pulse logic circuit 121 includes a read/write pulse generator (simply "pulse generator" hereafter) 122, which receives clock pulse CLK as well as incoming signals in the form of the encoded page signal PAGE_EN, a memory availability signal MEM_EN, and encoded read or write signals READ_EN and WRITE_EN, respectively. Clock pulse CLK can define the operating frequency for pulse generator 122, while pulse(s) READ_EN and WRITE_EN may provide the instructions for reading or writing of data in memory array 102. Signals PAGE_EN may specify the address for pages or sub-arrays within memory array 102 where operations are to be performed.

Memory check circuit 120 (FIG. 4) generates signal MEM_EN to indicate whether a requested sub-array 106 and/or page is available to perform the requested read or write operation. Memory check circuit 120 may receive incoming read pulses or write pulses in a first gate 124 for producing an output at a first logic level (e.g., logic one) when either an incoming write pulse or incoming read pulse is detected, or a second opposite logic level (e.g., logic zero) in the case where neither a read pulse nor a write pulse is detected. Memory check circuit 120 also includes a second gate 126 configured to receive incoming encoded read signals (Read_EN) or encoded write signals (Write_EN) in parallel with the read or write pulses delivered to first gate 124. If second gate receives an encoded read or write signal, it can output a first logic level (e.g., logic one) or otherwise outputs a second, opposite logic level (e.g., logic zero) to indicate the absence of incoming encoded pulses. Signals Read_En or Write_EN will arrive only if portions of memory array 102 are available for reading or writing, because encoding of read or write signals will only occur when circuitry is available for the relevant encoding. A third gate 128 receives the output from first gate 124 and second gate 126 to produce signal MEM_EN to indicate whether the requested sub-array(s) 106 or page(s) are available to perform the reading or writing for a particular pulse.

Referring now to FIG. 5, multiple PAGE_EN signals may be transmitted to read/write pulse generator 122 based on the number of pages in memory array 102. If incoming signal MEM_EN indicates that particular sub-array(s) 106 or pages are available for reading or writing, pulse generator 122 can use the incoming signals to generate a read or write pulse (each shown via READ_PULSE and WRITE_PULSE, respectively) to an "OR" gate 123. OR gate 123 can transmit the respective pulse to memory array 102 as signal MEM_CLK for data processing in system 100, as discussed herein. In the case where signal MEM_EN indicates that the relevant sub-array(s) 106 or pages are not available for reading or writing, read/write pulse generator 122 will not produce any signals for transmission via signal MEM_CLK.

Figure 6:
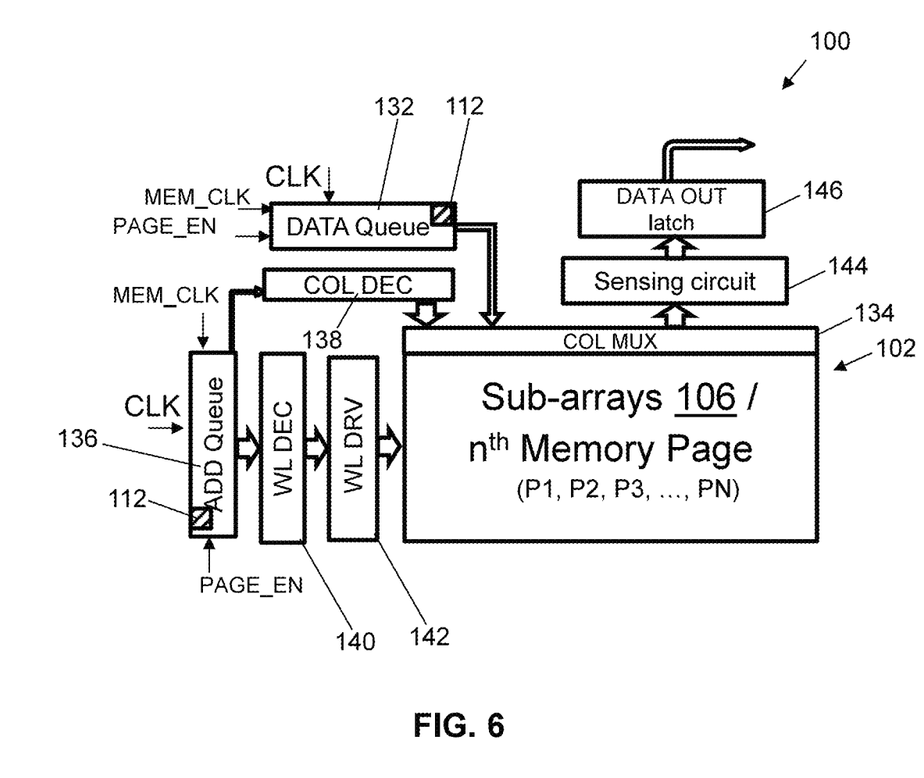
FIG. 6 shows a schematic view of an address queue and data queue in a control circuit for a memory array according to embodiments of the disclosure.

FIG. 6 provides a further example of system 100 and interconnected components for controlled transmitting of read and write signals in memory array 102. The components of system 100 shown in FIG. 6 may receive encoded address signals PAGE_EN transmitted, e.g., from pre-decoder 114 or other digital component(s) for producing such a signal. Additionally, system 100 may receive inputs in the form of clock signal CLK and/or an internal clock signal MEM_CLK representing the incoming read pulse or write pulse from pulse generator 122 (FIG. 5). System 100 may include, e.g., a data queue (labeled "DATA queue") 132 in the form of one or more latches for temporarily storing data for read pulses or write pulses that cannot be immediately transmitted to memory array 102. Thus, data queue 132 may include at least one temporary memory element 112 for storing pulses that must be held temporarily before they can be transmitted to sub-array(s) 106 in memory array 102. To control when/whether incoming pulses (MEM_CLK) must be held in data queue 132, an incoming encoded page signal PAGE_EN may indicate whether the page(s) specified in signal MEM_CLK are available for reading or writing at a given time. Clock signal CLK may be transmitted to the data queue to control the processing speed for data queue 132. Data queue 132 may be coupled to a column multiplexer (COL MUX) 134 of memory array 102 for transmission of signals to the column where a targeted sub-array 106 is located.

Other components of system 100 may control the address (e.g., page) selection of sub-arrays 106 for reading or writing as defined in each read pulse or write pulse transmitted to memory array 102. An address queue ("ADD queue") 136 also may include one or more temporary memory elements 112, and may receive clock signal CLK, incoming pulses MEM_CLK, and encoded page signal PAGE_EN in parallel with data queue 132 for system 100. Address queue 136 operates by identifying the pages and/or sub-arrays 106 in memory array 102 encoded in incoming pulses. Temporary memory elements 112 may temporarily store bits indicating the page(s) and/or sub-arrays currently undergoing a read or write operation, to prevent data from being written to and/or read from the same page(s) and/or sub-arrays simultaneously. To transmit a read or write pulse to a particular sub-array, the address queue may be coupled to a column decoder (COL DEC) 138 and column multiplexer 134 for memory array 102 to selectively enable sub-array(s) 106 in a particular column for reading or writing.

A word line decoder (WL DEC) 140 and word line driver (WL DRV) 142 can be coupled between address queue 136 and memory array 102 to enable a corresponding row of sub-arrays 106 for reading or writing. Column decoder 138 and column multiplexer 134 may operate in tandem with word line decoder 140 and word line driver 142 to enable only selected sub-arrays 106 and/or pages for reading or writing, pursuant to instructions included in signal MEM_CLK. To allow reading of data in memory array 102, a sensing circuit (e.g., a sense amplifier as discussed herein) 144 may be coupled to column multiplexer 134, and a latch ("DATA OUT latch") 146 may be coupled to sensing circuit 144 to transmit bits from memory array 102 as they are read. Through any of the various embodiments discussed herein, system 100 can control the transmission of read pulses and write pulses according to one or more operational methodologies discussed herein. Embodiments of system 100 may allow delaying of read or write pulses to a particular page or sub-array when a read operation or write operation initiated by an earlier pulse is still ongoing. Moreover, embodiments of system 100 may allow "out of order" processing by continuing to transmit read pulses or write pulses to other page, while delaying such pulses to a particular page when it is in use.

Figure 7:
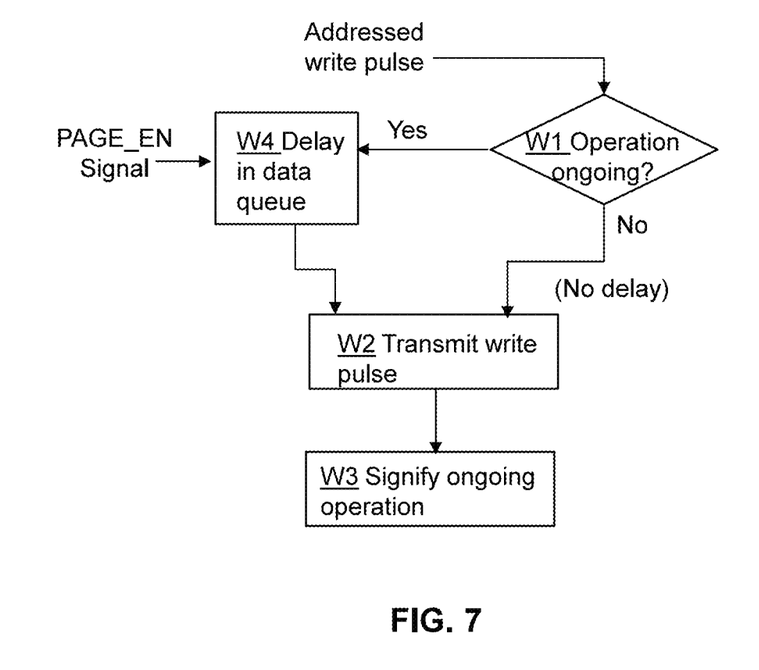
FIG. 7 shows an illustrative flow diagram for controlled transmitting of a write pulse as a first pulse according to embodiments of the disclosure.

Referring to FIGS. 1 and 7, operational details for transmitting a write pulse to memory array 102 are described in detail. FIG. 7 provides an example flow diagram for writing data to memory array 102 in embodiments of system 100 as depicted in FIG. 1. To write data to memory array 102, an addressed write pulse can be transmitted to control system 104 of system 100 (e.g., to a data latch thereof). The incoming write pulse may be "addressed" by having LSBs and/or other encoded data designating the sub-array(s) 106 and/or pages where data will be written to memory array 102. At process W1, memory circuit 104 determines (e.g., by one or more logic circuits, timers, etc., discussed herein) whether the sub-array(s) 106 and/or pages targeted for writing are undergoing a read operation or write operation. The determination may be implemented, e.g., based on whether a timer for implementing an earlier read or write operation has concluded, and/or whether other logic circuitry in control circuit 104 indicates that a read or write operation is not ongoing in the targeted sub-array(s) 106.

If a read or write operation is not ongoing (i.e., "No" at process W1), control circuit 104 will immediately transmit (e.g., instantly or on the next possible pulse) the write pulse to the targeted sub-array(s) 106 in process W2. The targeted sub-array(s) 106 thus may have data written thereto without control circuit 104 undertaking further actions on the incoming write pulse. Further processing of logic circuit 104 may include, e.g., signifying in process W3 that the targeted sub-array(s) 106 has an ongoing operation (e.g., currently being written) by initiating a timer, changing a logic level in temporary memory element(s) 112, and/or otherwise temporarily flagging the target sub-array(s) 106 in logic as being written. If a read or write operation is ongoing in the targeted sub-array(s) 106 (i.e., "Yes" at process W1), the method may instead continue to process W4 of delaying the write pulse in temporary memory elements 112 of memory array 102. To allow the delayed pulse to be transmitted to the correct sub-array(s) 106 at a subsequent time, the signal may remain in a data queue until expiration of a timer for the targeted sub-array(s) 106, and/or until signal PAGE_EN is delivered to temporary memory elements 112 to indicate that the targeted sub-array(s) 106 are no longer undergoing a read operation or write operation. Process W4 thus may vary based on the amount of time remaining before the targeted sub-array(s) 106 are available for reading or writing. In any case, the method may proceed to process(es) W2, W3 substantially as described herein after delaying of the write pulse concludes.

Figure 8:
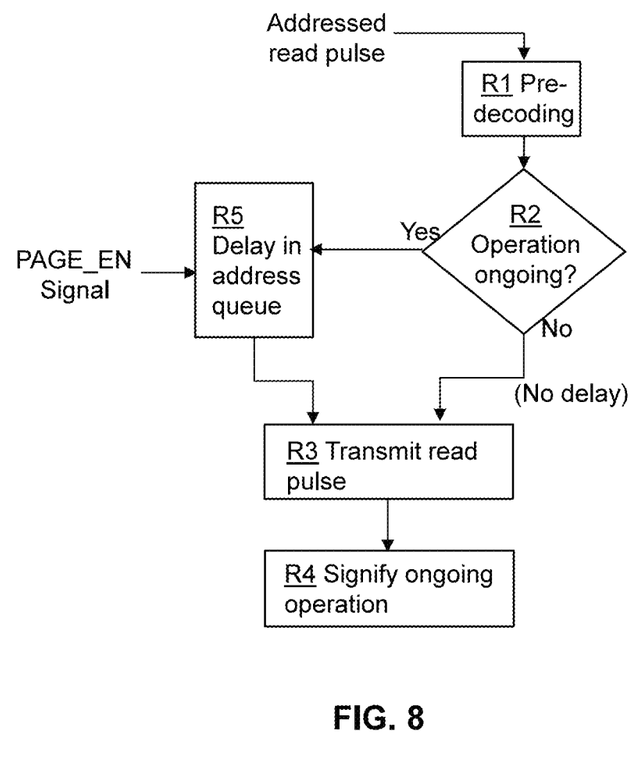
FIG. 8 shows an illustrative flow diagram for controlled transmitting of a read pulse as a first pulse according to embodiments of the disclosure.

Turning to FIGS. 1 and 8, embodiments of system 100 may transmit read pulses to memory array 102 using control circuit 104 via a method similar to the transmission of write pulses. In process R1, an addressed read pulse may be transmitted to control circuit 104 and may be received, e.g., in pre-decoder 114 (FIGS. 2, 3) thereof. The addressed read pulse may be encoded (e.g., with LSBs) to include targeted sub-array(s) 106 from which data is to be read from memory array 102. Pre-decoder 114 thus may identify the targeted sub-array(s) 106 before the read pulse is further processed in system 100. Control circuit 104 also may determine in operation R2 whether a read operation or write operation is already being undertaken in the targeted sub-array(s) 106 of memory array 102.

If the targeted sub-array(s) 106 are not being written or read (i.e., "No" at process R2), the method may proceed to process R3 of transmitting the read pulse to the targeted sub-arrays. In this case, the transmitting of the read pulse may be instantaneous or otherwise may occur on the next clock pulse. Due to the anticipated time needed to complete a write operation on the targeted sub-array(s) 106, methods according to the disclosure may include process R4 of signifying the ongoing read operation in the targeted sub-array(s) 106, e.g., by initiating a timer and/or transmitting a signal to an address queue of control circuit 104 to indicate the ongoing operation. If the targeted sub-array(s) 106 are currently being written or read (i.e., "Yes" at process R2), the method may instead proceed to process R5 of delaying the read signal, e.g., in temporary memory element(s) 112 located within an address queue of control circuit 104. The read signal may be delayed and held within the temporary memory element(s) 112 until the operation concludes, e.g., as indicated by the elapsing of a timer and/or receiving signal PAGE_EN to indicate that a read or write operation is not being performed in the targeted sub-array(s) 106. Once the delay concludes, the method may proceed to process R3 of transmitting a read pulse to the targeted sub-array(s) 106 as described herein. It is understood that embodiments of control circuit 104 may implement one or more instances of the operational methodologies shown in FIGS. 7 and 8, and discussed herein, in parallel with each other with respect to any desired number of pages and/or sub-arrays 106, or even with respect to multiple memory arrays 102.

Figure 9:
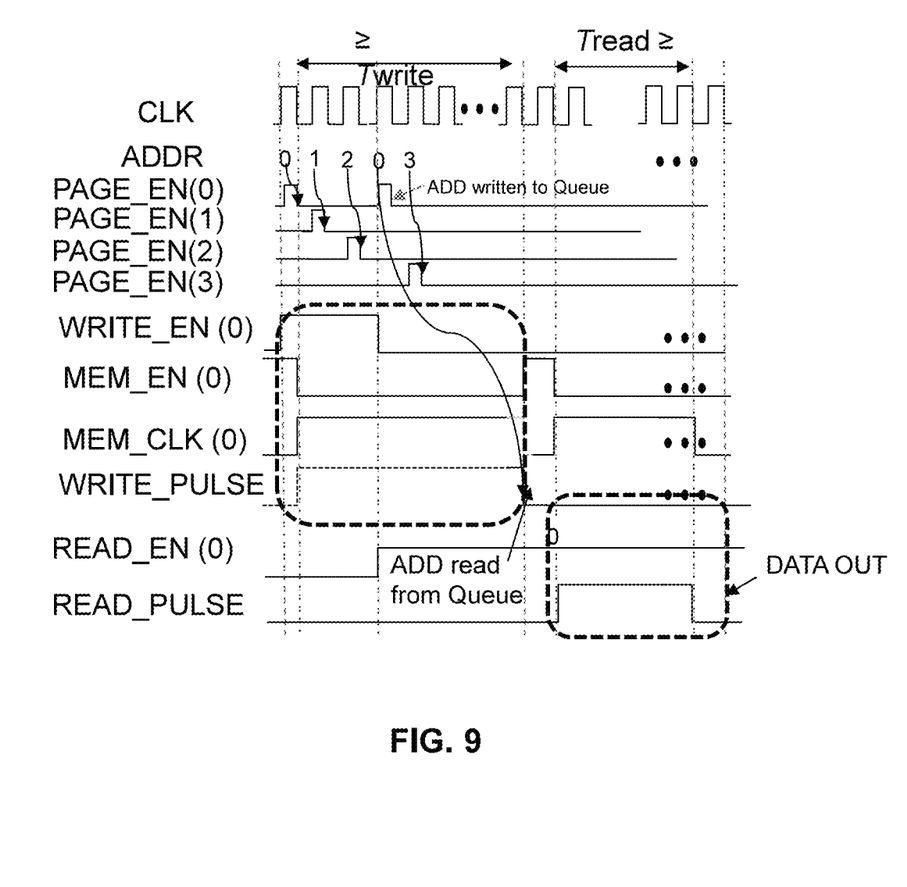
FIG. 9 shows an example timing diagram for processing an example set of read and write pulses according to embodiments of the disclosure.

FIG. 9 provides an example timing diagram to illustrate how control circuit 104 in system 100 controls reading and writing of data to sub-arrays 106 of pages in memory array 102. In this example, memory array 102 includes four pages numbers identified via numerals "0," "1," "2," and "3," respectively. A set of incoming data pulses may be transmitted to respective pages, and waveforms corresponding to each page are respectively labeled as PAGE_EN(0), PAGE_EN(1), PAGE_EN(2), and PAGE_EN(3). The row labeled "ADDR" indicates the page to which each incoming data signal is directed. In the FIG. 9 example, the first incoming data pulse is a write pulse directed to page "0," which requires, e.g., five or more consecutive clock pulses of time to be implemented. At this stage, the data pulse is transmitted to page "0" as signal "WRITE_EN(0)," thereby causing signals "MEM_EN(0)" and "MEM_CLK (0)" to change their logic level over the time period of writing.

The following two data signals are directed to pages "1" and "2," and thus may be transmitted to their respective pages of memory array 102 without being delayed. However, the next incoming data pulse constitutes a read pulse for sub-array(s) 106 on page "0," as indicated by waveform "READ_EN(0)") and the earlier write operation for this page has not concluded. Here, this second pulse to page "0" is written to the read queue in control circuit 104, where it is stored until the write operation on page "0" concludes. At the conclusion of the write pulse (i.e., when waveform WRITE_PULSE returns to logic zero from logic one), the read pulse may be transmitted from the data queue to page "0" and the read operation may commence immediately following the writing of data to sub-array(s) 106 in page "0." Even while the read pulse is delayed, further data may be transmitted to other pages for reading or writing as indicated by the subsequent pulses to page "3" in waveform PAGE_EN (3).

Embodiments of the disclosure may provide significant technical and commercial advantages. Embodiments of the disclosure may be particularly suitable for circuitry to read or write non-volatile memory (NVM) such as magnetic RAM, which otherwise may require more time to read or write than volatile memory. Moreover, the logic for controlling read or write pulses to memory array 102 (e.g., by selective delaying) may be achieved by a combination of logic gates and existing components (e.g., latches, multiplexers, demultiplexers, decoders, etc.) that are already present in a memory structure. Embodiments of system 100 and control circuit 104 may allow read pulses and write pulses to be transmitted to certain pages of memory and/or processed out of order where possible. This may prevent the ongoing reading or writing of data on one page from affecting the ability for other data to be written to and/or read from other pages of memory array 102. These and other attributes of system 100 described herein may require less than a one percent increase in the total surface area needed to implement a RAM architecture, while decreasing latency between successive read or write operations from tens of nanoseconds to as low as a single nanosecond or less.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the terms "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a memory array including a plurality of sub-arrays;
   a plurality of temporary storage units (TSUs) each coupled to a respective one of the plurality of sub-arrays, each TSU indicating whether the respective sub-array is undergoing one of a read operation and a write operation; and
   a control circuit coupled to each of the plurality of sub-arrays through a data bus, wherein the control circuit:
     transmits, with a delay, one of a read pulse and a write pulse as a first pulse in response to the sub-array undergoing one of the read operation and the write operation, and
     transmits, instantaneously, the first pulse to one of the plurality of sub-arrays in response to the sub-array not undergoing one of the read operation and the write operation.

2. The apparatus of claim 1, wherein the control circuit transmits a second pulse to another one of the plurality of sub-arrays during the delay of the transmitting of the first pulse in response to the sub-array undergoing one of the read operation and the write operation.

3. The apparatus of claim 1, wherein the first pulse includes a set of address bits identifying one of the plurality of sub-arrays.

4. The apparatus of claim 1, wherein at least one of the plurality of sub-arrays includes one of a magnetic random-access memory (MRAM) bit cell, a resistive random-access memory (RRAM) bit cell, and a ferroelectric random-access memory (FeRAM) bit cell.

5. The apparatus of claim 1, wherein at least one of the plurality of TSUs are included within a pre-decoder within the memory array.

6. The apparatus of claim 1, wherein the plurality of TSUs is configured to store a row address and a column address for each of the plurality of sub-arrays.

7. The apparatus of claim 1, wherein the plurality of TSUs is further configured to store data from the first pulse for writing to one of the plurality of sub-arrays.

8. A memory access circuit comprising:
   a memory array including a plurality of random-access memory (RAM) sub-arrays, each defining a respective data page;
   a data bus coupled to the plurality of RAM sub-arrays, each of the plurality of RAM sub-arrays having a respective coupling to the data bus;
   a plurality of temporary storage units (TSUs), each TSU of the plurality of TSUs coupled between the data bus and a respective one of the plurality of RAM sub-arrays, and indicating whether a target data page is undergoing one of a read operation and a write operation; and
   a control circuit coupled to the data bus for controlling access to the plurality of RAM sub-arrays, wherein the control circuit:
     transmits, with a delay, one of a read pulse and a write pulse as a first pulse in response to the RAM sub-array undergoing one of the read operation and the write operation, and transmits, instantaneously, the first pulse to one of the plurality of RAM sub-arrays in response to the RAM sub-array not undergoing one of the read operation and the write operation.

9. The memory access circuit of claim 8, wherein the control circuit transmits a second pulse to another data page during the delay of transmitting the first pulse in response to the RAM sub-array undergoing one of the read operation and the write operation.

10. The memory access circuit of claim 8, wherein the first pulse includes a set of address bits identifying the target data page.

11. The memory access circuit of claim 8, wherein at least one of the plurality of RAM sub-arrays includes one of a magnetic random-access memory (MRAM) bit cell, a resistive random-access memory (RRAM) bit cell, and a ferroelectric random-access memory (FeRAM) bit cell.

12. The memory access circuit of claim 8, wherein at least one of the plurality of TSUs is included within a pre-decoder within the memory array.

13. The memory access circuit of claim 8, wherein the plurality of TSUs store a row address and a column address for each data page.

14. The memory access circuit of claim 8, wherein the plurality of TSUs temporarily store data for writing to the target data page.

15. A method comprising:
    detecting, in a control circuit coupled to a memory array having a plurality of sub-arrays coupled through a data bus, one of a read pulse and a write pulse as a first pulse for a selected sub-array;
    transmitting, with a delay, one of the read pulse and the write pulse as a first pulse in response to the sub-array undergoing one of a read operation and a write operation; and
    transmitting, instantaneously, the first pulse to one of the plurality of sub-arrays in response to the sub-array not undergoing one of the read operation and the write operation.

16. The method of claim 15, further comprising transmitting a second pulse to another one of the plurality of sub-arrays during transmitting the first pulse with the delay in response to the sub-array undergoing one of the read operation and the write operation.

17. The method of claim 15, further comprising decoding a plurality of address bits in the first pulse to identify the selected sub-array.

18. The method of claim 17, further comprising storing the plurality of address bits in a temporary storage unit (TSU) of the memory array in response to the selected sub-array undergoing one of the read operation and the write operation.

19. The method of claim 18, further comprising storing data for the write pulse to the TSU in response to the selected sub-array undergoing one of the read operation and the write operation.

20. The method of claim 15, wherein transmitting the write pulse as the first pulse includes writing data to one of a magnetic random-access memory (MRAM) bit cell, a resistive random-access memory (RRAM) bit cell, and a ferroelectric random-access memory (FeRAM) bit cell.

* * * * *